United States Patent
Chen

(10) Patent No.: US 7,706,185 B2
(45) Date of Patent: Apr. 27, 2010

(54) READING CIRCUITRY IN MEMORY

(75) Inventor: Chung-Kuang Chen, Pan Chiao (TW)

(73) Assignee: Macronix International Co., Ltd., Hsinchu (TW)

( * ) Notice: Subject to any disclaimer, the term of this patent is extended or adjusted under 35 U.S.C. 154(b) by 96 days.

(21) Appl. No.: 11/783,334

(22) Filed: Apr. 9, 2007

(65) Prior Publication Data

US 2008/0247244 A1   Oct. 9, 2008

(51) Int. Cl.
*G11C 11/34* (2006.01)

(52) U.S. Cl. .................... 365/185.16; 365/185.17; 365/185.18; 365/185.21; 365/185.23; 365/185.25

(58) Field of Classification Search ............ 365/185.16, 365/185.17, 185.18, 185.21, 185.23, 185.25
See application file for complete search history.

(56) References Cited

U.S. PATENT DOCUMENTS

| | | | | |
|---|---|---|---|---|
| 5,027,321 A | * | 6/1991 | Park ..................... | 365/185.16 |
| 5,031,148 A | * | 7/1991 | Kitazawa et al. ........ | 365/185.21 |
| 5,440,518 A | * | 8/1995 | Hazani .................. | 365/185.16 |
| 5,561,624 A | * | 10/1996 | Chen et al. ............. | 365/185.16 |
| 5,644,533 A | * | 7/1997 | Lancaster et al. ....... | 365/185.18 |
| 5,680,347 A | * | 10/1997 | Takeuchi et al. ........ | 365/185.23 |
| 6,301,158 B1 | * | 10/2001 | Iwahashi ............... | 365/185.23 |
| 7,345,917 B2 | * | 3/2008 | Hung et al. ............. | 365/185.16 |
| 7,388,789 B2 | * | 6/2008 | Ha ...................... | 365/185.23 |
| 7,411,834 B2 | * | 8/2008 | Kusakabe et al. ....... | 365/185.23 |

* cited by examiner

*Primary Examiner*—Trong Phan
(74) *Attorney, Agent, or Firm*—Rabin & Berdo, P.C.

(57) ABSTRACT

A reading circuit in a memory having a first memory cell coupled to a first bit line and a second bit line and a second memory cell coupled to the second bit line and a third bit line, is provided. The reading circuitry comprises a source side sensing circuit, a drain side bias circuit, a first selection circuit and a second selection circuit. The drain side bias circuit provides a drain side bias. The first selection circuit connects the second bit line and the third bit line to the drain side bias circuit in a read operation mode. The second selection circuit connects the first bit line to the source side sensing circuit so that a source current of the first memory cell is sensed.

10 Claims, 3 Drawing Sheets

READING CIRCUITRY IN MEMORY

BACKGROUND OF THE INVENTION

1. Field of the Invention

The invention relates in general to a reading circuitry in a memory, and more particularly to a reading circuitry in a memory performing read operation by sensing a source current from the source side of a memory cell.

2. Description of the Related Art

Memory devices have now been widely used in the field of data storage. A memory has many memory cells normally arranged in an array. Each row of memory cells corresponds to a word line, and each column of memory cells corresponds to a bit line. Each memory cell includes a transistor. The first end of the transistor is coupled to the bit line, the second end is coupled to the other bit line, and the control end is coupled to the corresponding word line.

Each memory cell defines a binary bit, that is, either of "0" and "1". Normally, the programmed-bit represents "0", and the erased bit represents "1". Besides, in some forms of the memory, the memory cell stores two binary bits, that is, the first bit and the second bit. The first bit may represent "0" or "1", and the second bit also may represent "0" or "1".

Generally speaking, in a read operation mode, the memory determines the state of a memory cell by sensing the current received by the memory cell. Referring to FIG. 1, a circuit diagram of a conventional memory is shown. The memory 100 includes many memory cells and a memory read operation circuit 110. In FIG. 1, the memory cells are exemplified by a first memory cell M1 and a second memory cell M2 only, but is not limited thereto. The memory read operation circuit 110 includes a sensing selection circuit 112, a sensing circuit 113, a charging selection circuit 114 and a drain side bias circuit 115.

The first memory cell M1 is coupled to a first bit line BL1 and a second bit line BL2. The second memory cell M2 is coupled to the second bit line BL2 and a third bit line BL3. Both the first memory cell M1 and the second memory cell M2 are controlled by a word line WL. In a read operation mode, the second bit line BL2 is connected to the sensing circuit 113 by the sensing selection circuit 112. Besides, the first bit line BL1 is connected to the drain side bias circuit 115 by the charging selection circuit 114. That is, the first end of the first memory cell M1 has a drain voltage $V_D$. The sensing circuit 113 senses the sensing current $I_{sen}$ flowing through the sensing selection circuit 112 to determine the state of the first memory cell M1. If the sensing current $I_{sen}$ is larger than a reference current $I_{ref}$, then the first memory cell M1 is determined as "1". If the sensing current $I_{sen}$ is smaller than reference current $I_{ref}$, then the first memory cell M1 is determined as "0".

Besides, in a read operation mode, the third bit line BL3 is floating and will be charged up by $I_{err}$ during senging operation. That is, the first memory cell M1 has a discharging current from the second memory cell M2.

However, when the first memory cell M1 represents "1" and the second memory cell M2 also represents "1", there will be a leakage current, that is, the error current $I_{err}$, flowing from the second end of the second memory cell M2 to the first end of the second memory cell M2. Under the above circumstances, the sensing current $I_{sen}$ does not equal to the drain current $I_d$, reducing the reliability in the read operation of the memory 100, and deteriorating the overall performance of the memory 100.

SUMMARY OF THE INVENTION

The invention is directed to a memory and a read operation circuit thereof performing read operation by sensing a source current from the source side of a memory cell.

According to a first aspect of the present invention, a reading circuitry in a memory is provided. The memory includes a first memory cell and a second memory cell. The first memory cell is coupled to a first bit line and a second bit line. The second memory cell is coupled to the second bit line and a third bit line. The reading circuittry includes a source side sensing circuit, a drain side bias circuit, a first selection circuit and a second selection circuit. The drain side bias circuit provides a drain side bias. The first selection circuit connects the second bit line and the third bit line to the drain side bias circuit in a read operation mode. The second selection circuit connects the first bit line to the source side sensing circuit in the read operation mode so that a source current of the first memory cell is sensed.

According to a second aspect of the present invention, a reading circuitry in a memory is provided. The memory has a first memory cell, a second memory cell and a third memory cell. The first memory cell is coupled to a first bit line and a second bit line. The second memory cell is coupled to the second bit line and a third bit line. The third memory cell is coupled to the third bit line and a fourth bit line. The reading circuitry includes a source side sensing circuit, a drain side bias circuit, a first selection circuit and a second selection circuit. The drain side bias circuit provides a drain side bias. The first selection circuit connects the second bit line and the third bit line to the drain side bias circuit in a read operation mode. The second selection circuit connects the first bit line to the source side sensing circuit in the read operation mode so that a source current of the first memory cell is sensed, and connects the fourth bit line to the source side sensing circuit in the read operation mode so that a source current of the third memory cell is sensed.

The invention will become apparent from the following detailed description of the preferred but non-limiting embodiments. The following description is made with reference to the accompanying drawings.

DETAILED DESCRIPTION OF THE INVENTION

The invention provides a reading circuitry in a memory performing read operation by sensing a source current from the source side of a memory cell.

Figure 1:
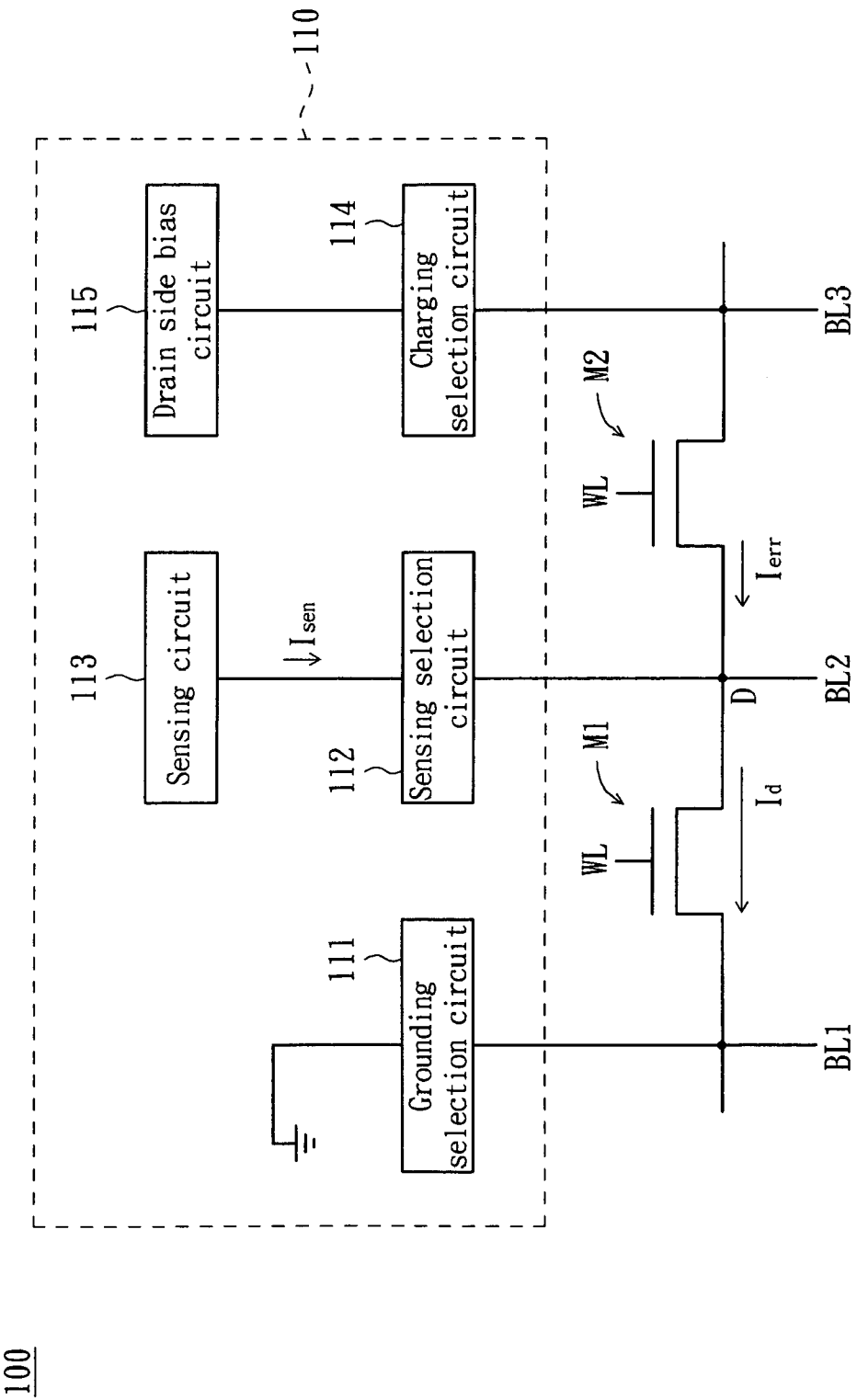
FIG. 1 is a circuit diagram of a conventional memory.
Figure 2:
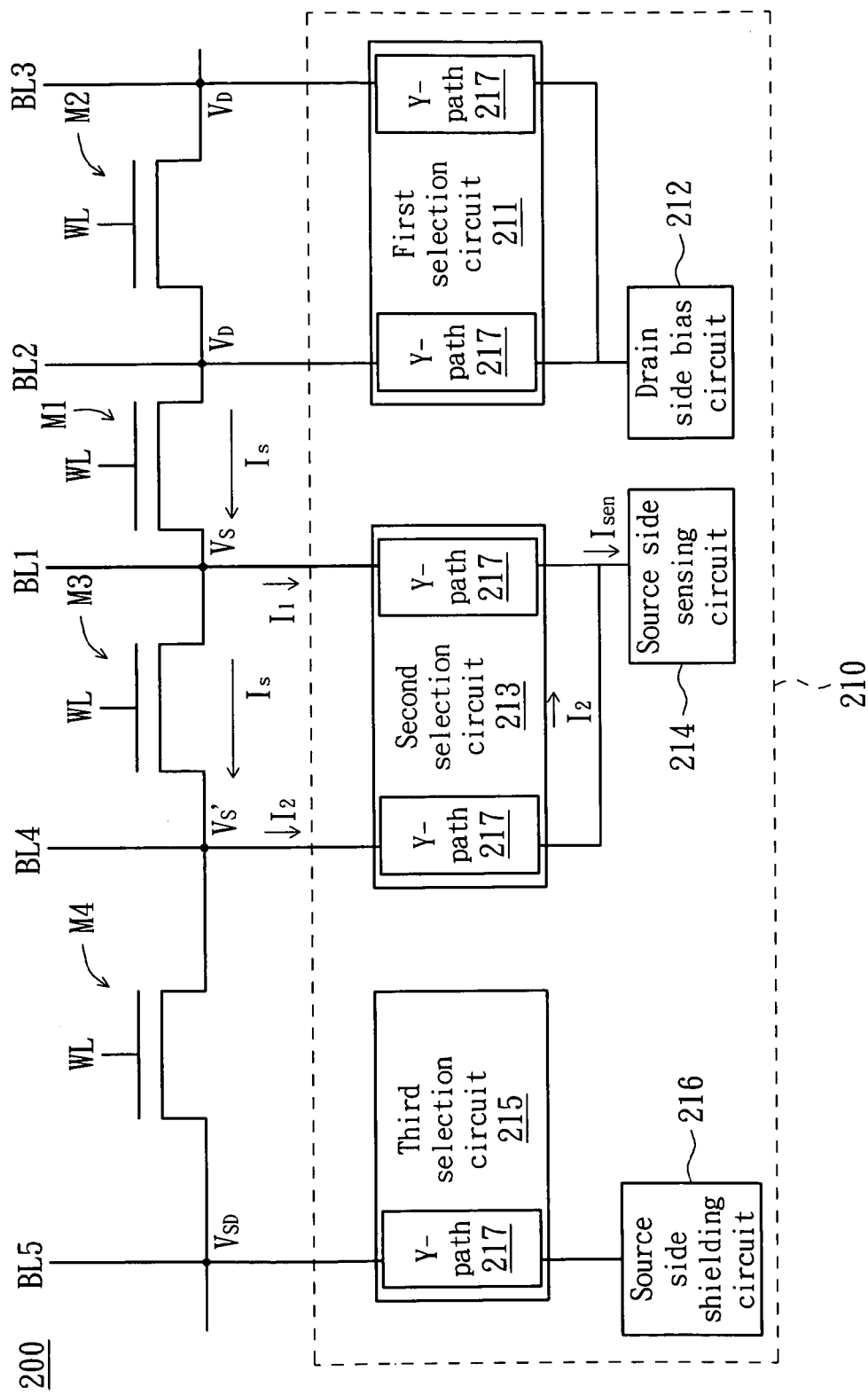
FIG. 2 is a circuit diagram of a memory according to a preferred embodiment of the invention.

Referring to FIG. 2, a circuit diagram of a memory according to a preferred embodiment of the invention is shown. The memory 200 includes many memory cells and a memory read operation circuit 210. FIG. 2 is exemplified by a first memory cell M1, a second memory cell M2, a third memory cell M3 and a fourth memory cell M4, and it is not limited herein (for example, any four neighboring memory cells can be regarded as the first to fourth memory cells M1 to M4, and other memory cells of the memory 200 are not shown in FIG. 2 but shown in FIG. 3). The first memory cell M1 is coupled to a first bit line BL1 and a second bit line BL2. The second memory cell M2 is coupled to the second bit line BL2 and a third bit line BL3. The third memory cell M3 is coupled to the first bit line BL1 and a fourth bit line BL4. The fourth memory cell M4 is coupled to the fourth bit line BL4 and a fifth bit line BL5. The gate of the first memory cell M1, the gate of the second memory cell M2, the gate of the third memory cell M3, the gate of the fourth memory cell M4 are all controlled by a word line WL. The drain side bias circuit 212 provides a drain side bias $V_D$.

The memory read operation circuit 210 includes a first selection circuit 211, a drain side bias circuit 212, a second selection circuit 213, a source side sensing circuit 214, a third selection circuit 215, and a source side shielding circuit 216 The first selection circuit 211 is coupled to the drain side bias circuit 212. The second selection circuit 213 is coupled to the source side sensing circuit 214. The third selection circuit 215 is coupled to the source side sensing circuit 216. In a read operation mode, the second bit line BL2 is connected to the drain side bias circuit 212 by the first selection circuit 211. That is, the second end of the first memory cell M1 has a drain side bias D, such that the first memory cell M1 can perform read operation. The first memory cell M1 stores a single bit, or a first bit and a second bit, and there is no restriction.

Besides, the third bit line BL3 is connected to the drain side bias circuit 212 by the first selection circuit 211. Both the first end and the second end of the second memory cell M2 have a drain side bias D, such that the first memory cell M1 is separated from the memory cell (not illustrated in the diagram) at the right hand side of the second memory cell M2 by the second memory cell M2. Compared with a conventional memory, the memory and the read operation circuit thereof disclosed in the present embodiment of the invention save the use of the drain side bias circuit.

In the above read operation mode, the first bit line BL1 is connected to the source side sensing circuit 214 by the second selection circuit 213. Since the first memory cell M1 performs read operation, the first end of the first memory cell M1 has a source voltage $V_S$, and the source side sensing circuit 214 senses a sensing current $I_{sen}$ flowing through the second selection circuit 213 to determine the state of the first memory cell M1. Meanwhile, the sensing current $I_{sen}$ sensed by the source side sensing circuit 214 will be equal to the source current $I_1$. If the sensing current $I_{sen}$ is larger than a reference current $I_{ref}$ outputted by a reference memory cell (not illustrated in the diagram), then the data stored in the first memory cell M1 is determined as "1". If the sensing current $I_{sen}$ is smaller than reference current $I_{ref}$, then the data stored in the first memory cell M1 is determined as "0".

Besides, the memory 200 further includes a third memory cell M3 coupled to the first bit line BL1 and a fourth bit line BL4, and the gate of the third memory cell M3 is controlled by the word line WL. Due to the leakage current, for example, the leakage current $I_{s2}$, which may be generated and flow from the second end of the third memory cell M3 to the first end of the third memory cell M3, the sensing current $I_{sen}$ will be equal to the current $I_1$ and smaller than the source current $I_s$, such that the source side sensing circuit 214 may erroneously determine the state of the first memory cell M1.

Therefore, in the read operation mode, the fourth bit line BL4 is connected to the source side sensing circuit 214 by the second selection circuit 213. That is, the first end of the third memory cell M3 also has a voltage $V_S'$ closed to $V_S$, such that the leakage current $I_{s2}$ is decreased and parts of the leakage current $I_{s2}$ flow back to the source side sensing circuit 214. The sensing current $I_{sen}$ sensed by the source side sensing circuit 214 will be more closed to the source current $I_s$, and the source side sensing circuit 214 will be able to correctly determine the state of the first memory cell M1 and increase the reliability in the read operation of the memory 200. Besides, the memory 200 can increase the reliability in the read operation of more memory cells according to the same method disclosed in the third memory cell M3, and the memory 200 is not limited to the use of only the third memory cell M3 indicated in FIG. 2.

The memory 200 further includes a fourth memory cell M4 coupled to the fourth bit line BL4 and a fifth bit line BL5. The word line WL controls the gate of the fourth memory cell M4. The memory read operation circuit 210 further includes a third selection circuit 215 and a source side shielding circuit 216. The source side shielding circuit 216 provides a shielding voltage $V^{SD}$. The third selection circuit 215 is coupled to the source side shielding circuit 216.

The fourth memory cell M4 will still generate a loading effect with respect to the third memory cell M3 and the first memory cell M1. The loading effect may be very small. In a read operation mode, the fifth bit line BL5 is connected to the source side shielding circuit 215 by the third selection circuit 215, such that the first end of the fourth memory cell M4 has a shielding voltage $V_{SD}$. The dimension of the shielding voltage $V_{SD}$ exactly blocks the source current Is or the leakage current $I_{s2}$, such that the source current Is or the leakage current $I_{s2}$ will not lose via the fourth memory cell M4. Compared with the above memory 200, there is no shielding at the source side of a conventional memory. That is, a minor leakage current will be generated at the source side of the memory cell of the conventional memory, causing the reliability in the read operation of the memory to decrease.

According to the memory 200 disclosed in the above embodiments of the invention, each selection circuit has many Y-path 217 respectively corresponding to each bit line.

Figure 3:
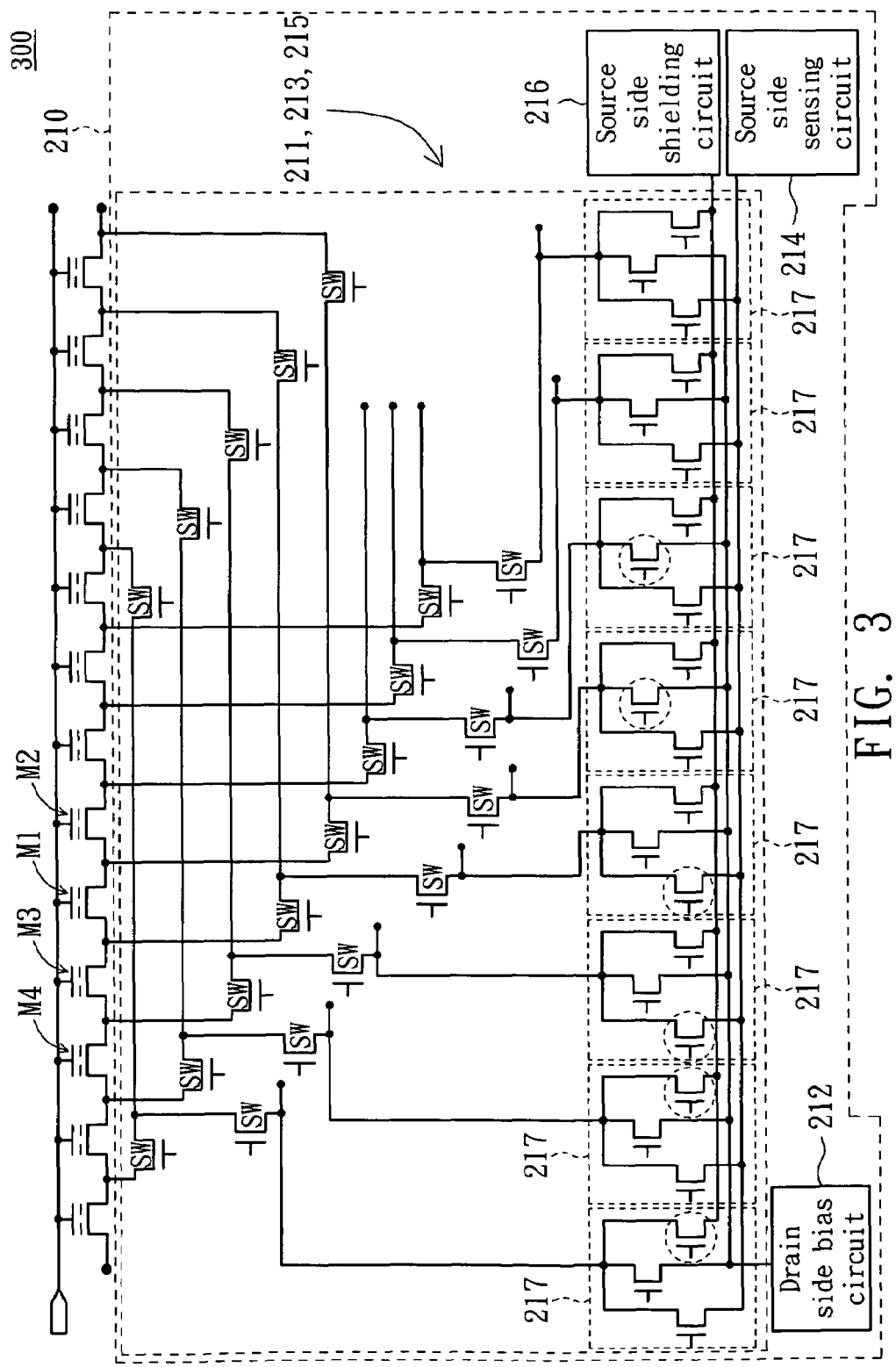
FIG. 3 is a detailed circuit diagram of an example of the memory according to a preferred embodiment of the invention.

Referring to FIG. 3, a detailed circuit diagram of an example of the memory according to a preferred embodiment of the invention is shown. The first selection circuit 211, the second selection circuit 213 and the third selection circuit 215 are substantially composed of several switches SW and Y-paths 217. The detailed principles of the operation of the memory 200 are disclosed in the above embodiments already, and are not repeated here.

According to the memory and read operation circuit thereof disclosed in the above embodiments of the invention, the source side sensing circuit performs read operation by sensing a source current from the source side of a memory cell. Besides, the memory cells are separated by the drain side bias circuit, thus the use of conventional drain side bias circuit is saved. Meanwhile, the source side shielding circuit is used, such that the source side of the memory cell will not have leakage currents, and the reliability in the read operation of memory is increased.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A reading circuitry in a memory having a first memory cell being coupled to a first bit line and a second bit line and a second memory cell being coupled to the second bit line and a third bit line, the reading circuitry comprising:
- a source side sensing circuit;
- a drain side bias circuit used for providing a drain side bias;
- a first selection circuit coupled to the second bit line and the third bit line; and
- a second selection circuit coupled to the first bit line;
- wherein when the first memory cell is read, the first selection circuit connects the second bit line and the third bit line to the drain side bias circuit to receive the drain side bias, and the second selection circuit connects the first bit line to the source side sensing circuit, so that the source side sensing circuit senses a source current of the first memory cell in order to read the first memory cell.

2. The reading circuitry according to claim 1, wherein the memory further comprises a third memory cell coupled to the first bit line and a fourth bit line, and the fourth bit line is connected to the source side sensing circuit via the second selection circuit, such that the source side sensing circuit senses a source current of the third memory cell.

3. The reading circuitry according to claim 2, the memory further comprises a fourth memory cell coupled to the fourth bit line and a fifth bit line, the reading circuitry further comprises:
- a source side shielding circuit used for providing a shielding voltage; and
- a third selection circuit for connecting the fifth bit line to the source side shielding circuit in the read operation mode.

4. The reading circuitry according to claim 1, the first memory cell and the second memory cell respectively have a gate side coupled to a word line.

5. The reading circuitry according to claim 1, wherein the first memory cell stores a first bit and a second bit.

6. The reading circuitry according to claim 1, wherein a first end of the first memory cell coupled to the first bit line has a source current, and the source side sensing circuit senses the source current flowing through the second selection circuit to determine a state of the first memory cell.

7. A reading circuitry in a memory having a first memory cell being coupled to a first bit line and a second bit line, a second memory cell being coupled to the second bit line and a third bit line and a third memory cell being coupled to the first bit line and a fourth bit line, the circuitry comprising:
- a source side sensing circuit;
- a drain side bias circuit used for providing a drain side bias;
- a first selection circuit coupled to the second bit line and the third bit line; and
- a second selection circuit coupled to the first bit line and the fourth bit;
- wherein when the first memory cell is read, the first selection circuit connects the second bit line and the third bit line to the drain side bias circuit to receive the drain side bias, and the second selection circuit connects the first bit line and the fourth bit line to the source side sensing circuit, so that the source side sensing circuit senses a source current of the first memory cell in order to read the first memory cell.

8. The reading circuitry according to claim 7, the memory further comprises a fourth memory cell coupled to the fourth bit line and a fifth bit line, the reading circuitry further comprises:
- a source side shielding circuit used for providing a shielding voltage; and
- a third selection circuit for connecting the fifth bit line to the source side shielding circuit such that the source current will not lose via the fourth memory cell.

9. The reading circuitry according to claim 7, the memory cells respectively have a gate side coupled to a word line.

10. The reading circuitry according to claim 7, wherein the first memory cell stores a first bit and a second bit.

* * * * *